United States Patent [19]

Osada et al.

[11] Patent Number: 5,603,879
[45] Date of Patent: Feb. 18, 1997

[54] METHOD OF MOLDING RESIN TO SEAL ELECTRONIC PARTS USING TWO EVACUATION STEPS

[75] Inventors: Michio Osada; Yoshihisa Kawamoto; Makoto Matsuo; Koichi Araki, all of Kyoto, Japan

[73] Assignee: Towa Corporation, Uji, Japan

[21] Appl. No.: 229,232

[22] Filed: Apr. 18, 1994

[30] Foreign Application Priority Data

Apr. 22, 1993 [JP] Japan .................... 5-120745

[51] Int. Cl.⁶ ............... B29C 45/14; B29C 45/63
[52] U.S. Cl. ............... 264/102; 264/272.14; 264/272.15; 264/272.17; 264/275; 425/546
[58] Field of Search ............ 264/102, 272.15, 264/272.17, 328.5, 510, 328.4, 511, 513, 271.1, 275, 272.14; 425/116, 129.1, 544, 546

[56] References Cited

U.S. PATENT DOCUMENTS

| 4,599,062 | 7/1986 | Konishi ............. 264/272.17 |
| 4,793,785 | 12/1988 | Osada . |
| 4,900,485 | 2/1990 | Murakami ............. 425/116 |
| 4,927,590 | 5/1990 | Poelzing ............. 264/328.5 |
| 5,059,373 | 10/1991 | Hirabayashi . |
| 5,082,615 | 1/1992 | Sakai ............. 264/510 |
| 5,204,122 | 4/1993 | Konishi ............. 425/544 |
| 5,366,364 | 11/1994 | Tanaka et al. ............. 425/116 |
| 5,405,255 | 4/1995 | Neu ............. 264/272.17 |

FOREIGN PATENT DOCUMENTS

| 0096132 | 12/1983 | European Pat. Off. . |
| 0293954 | 12/1988 | European Pat. Off. . |
| 2532242 | 3/1984 | France . |
| 60-132716 | 7/1985 | Japan . |
| 60-251633 | 12/1985 | Japan .................. 264/328.5 |
| 60-251635 | 12/1985 | Japan . |
| 61-085830 | 5/1986 | Japan . |
| 62-282440 | 12/1987 | Japan . |
| 63-007638 | 1/1988 | Japan . |
| 2086796 | 5/1982 | United Kingdom . |
| 2126155 | 3/1984 | United Kingdom . |
| 2252746 | 8/1992 | United Kingdom . |
| WO85/05069 | 11/1985 | WIPO . |

OTHER PUBLICATIONS

"Analysis of Epoxy Resin by TG/GCMS system (II)"; Shimadzu Application News.

Primary Examiner—Angela Ortiz
Attorney, Agent, or Firm—W. G. Fasse; W. F. Fasse

[57] ABSTRACT

In a method of molding resin to seal electronic parts, an internal die space defined at least by pots, cull portions, resin passages and cavities when an upper mold section and a lower mold section are closed, is cut off or sealed from the exterior atmosphere. Thereupon the die space is evacuated using a first evacuation by a vacuum source and a second or instantaneous evacuation by an instantaneous evacuation mechanism. The vacuum source for the first evacuation may be an active vacuum pump, while the instantaneous evacuation mechanism may be a vacuum tank that has been previously pumped down, for example. According to this method, it is possible to quickly improve the degree of vacuum in the internal die space by efficiently and reliably discharging air, moisture and gas from the internal die space to the exterior due to a synergistic action of the evacuation and the instantaneous evacuation. Consequently, the formation of voids in resin molded members is prevented.

17 Claims, 6 Drawing Sheets

METHOD OF MOLDING RESIN TO SEAL ELECTRONIC PARTS USING TWO EVACUATION STEPS

CROSS-REFERENCE TO RELATED APPLICATION

The present application is related to copending U.S. patent application Ser. No. 08/173,150, filed on Dec. 21, 1993, now U.S. Pat. No. 5,435,953, issue date Jul. 25, 1995, which is a File Wrapper Continuation of U.S. patent application Ser. No. 07/819,451, filed on Jan. 10, 1992 (now abandoned).

BACKGROUND OF THE INVENTION

1. Field of the Invention

The present invention relates to improvements in a method of molding resin to seal electronic parts, such as ICs, LSIs, diodes or capacitors mounted on lead frames, for example, with thermosetting resin materials. More particularly, the invention relates to improvements for preventing electronic parts molded and sealed with resin (mold packages) from having voids formed in the interior and the exterior thereof, as well as for preventing bonding wires from suffering a wire sweep phenomenon caused by the resin, and also attaining an improvement in adhesion between the lead frames and the resin.

2. Description of the Background Art

In general, an electronic part is molded and sealed with resin by a transfer mold method, which is generally carried out using a resin sealing/molding apparatus, for example, in the following manner.

A fixed upper mold section and a movable lower mold section of the resin sealing/molding apparatus are initially heated to a resin molding temperature by heating means and are then opened. An apparatus having an inverse structure, namely a movable upper mold section and a fixed lower mold section is also known.

Then, a lead frame carrying an electronic part is set at a prescribed position on a die surface of the lower mold section, while a resin tablet is supplied into a pot of the lower mold section.

Then, the lower mold section is upwardly moved so that the upper mold section and the lower mold section are closed. Thus, the electronic part and the lead frame carrying the part are set between upper and lower cavities that are provided opposite one another in the die surfaces of the lower mold section and the upper mold section, while the resin tablet in the pot is heated so that it gradually melts.

Then, the resin tablet in the pot is pressurized by a plunger so that the melted resin material is injected or charged into the cavities, whereby the electronic part and the lead frame set in the cavities are sealed in a resin molded member, which is molded to have a shape corresponding to the shapes of the cavities.

After a lapse of time required for hardening the melted resin material, the upper mold section and the lower mold section may be opened so as to release the resin molded member and the lead frame from the cavities while releasing the hardened resin from a resin passage by means of a mold releasing mechanism.

When the upper mold section and the lower mold section are closed, air containing moisture such as that in the atmosphere, for example, remains in a space defined by the pot, the resin passage and the cavities. Such residual air may enter the melted resin material to cause problems during resin molding such as the formation of voids in the interior and the exterior of the resin molded member.

In order to cope with this problem, the cavities are made to communicate with the exterior through proper air vents and the melted resin material held in the pot is transferred through the resin passage and injected or charged into the cavities, so that the aforementioned residual air and the like are naturally discharged to the exterior through the air vents.

While the air remaining in the pot, the resin passage and the cavities can be naturally discharged through the air vents as hereinabove described, it is impossible in practice to effectively inhibit the formation of internal voids and outer surface defects in the resin molded member. Thus, it is impossible to reliably solve the problem of deterioration in moisture resistance and appearance of the product.

When internal voids are formed in the resin molded member, the adhesion between the lead frame and the resin is deteriorated, and moisture easily infiltrates into the product through the clearances or gaps between the resin and the lead frame, which deteriorates the moisture resistance of the product, for example. Further, the resin molded member is easily cracked or chipped by forces that are applied to bases or ends of outer lead portions projecting from the resin molded member whereby the lead ends are bent. Thus, it is impossible to attain the high quality and high reliability that are absolutely required for this product.

The internal voids that are formed in the resin molded member mainly result from at least one of air and moisture contained in the resin tablet. The resin tablet, which is formed by merely compacting resin powder into a prescribed shape, generally contains a large quantity of air, which further contains moisture in the atmosphere. Furthermore, the large quantity of air contained in the resin tablet is present in the form of a number of independent bubbles, which are isolated from each other, and which cannot communicate with each other and with the surface of the resin tablet for ventilation or expulsion from the tablet.

When the resin tablet is heated to a resin molding temperature of at least 175° C., for example, the air or moisture contained in the resin tablet forms water vapor, which enters the melted resin material with the air remaining in the aforementioned internal die space. Thus, the resin material is injected or charged into the cavities in this state, and hence voids are formed in the interior and the exterior of the resin molded member due to the air or moisture contained in the resin tablet.

Further, gas such as combustion gas, which is generated upon heating of the resin tablet, also serves as a cause for forming voids in the interior and the exterior of the resin molded member.

In order to prevent the formation of voids in the interior and the exterior of the resin molded member, the following counter-measure may be employed. For example, the air remaining in the aforementioned internal die space between the upper mold section and the lower mold section may be discharged to the exterior by a vacuum pump, thereby preventing the residual air from entering the melted resin material.

When ordinary air discharge means such as the vacuum pump is employed, however, the overall time duration of the resin sealing/molding process is disadvantageously lengthened, because a long time is generally required for increasing the degree of vacuum in the internal die space to a prescribed or sufficient level.

In general, an electronic part is molded and sealed with a thermosetting resin such as epoxy resin, for example, and hence the resin tablet that is supplied into the aforementioned internal die space (pot) is hardened with time after the same is heated and melted.

When the internal die space is evacuated for a long time using ordinary air discharge means, therefore, the melted resin material undergoes hardening which deteriorates its flowability. Thus, the evacuating operation is preferably carried out in a short time in consideration of this point.

As hereinabove described, gas such as combustion gas that is generated upon heating of the resin tablet also forms voids and defects in the interior and the exterior of the resin molded member. Such gas is generated by a coupling agent, a mold release agent, a flexibility agent or other additive agents contained in the resin tablet, which vaporize when the resin tablet is heated to a resin molding temperature of 175° C., for example, and melted.

In another conventional countermeasure for preventing the formation of voids in the resin molded member, the melted resin material which is injected into the cavities is pressurized to have an increased resin pressure for compressing voids contained therein, thereby compressing voids formed in the interior of the resin molded member to a negligible degree.

However, the conventional method of compressing the voids under a high pressure has the following problems:

(1) This method is disadvantageous in consideration of the durability of the apparatus, dangerousness in operation, the cost and other known disadvantages, due to the requirement for a large-sized press machine which can carry out high-pressure compression molding.

(2) Viscous resin which starts to be hardened in the cavities in a final stage of the compression step is made to flow in such high-pressure compression molding. Thus, a bonding wire for electrically coupling an electrode of a semiconductor element and the outer lead portion is inclined or swept toward the direction of resin flow in the so-called wire sweep phenomenon. This may lead to serious problems such as contact between the bonding wire and an adjacent one, disengagement of a bonding pad wire from the electrode, or wire breaking.

In the aforementioned conventional countermeasure for preventing the formation of voids, further, it is impossible to make effective use of multistage injection for preventing the problem of the bonding wire sweeping phenomenon, electrode disengagement, wire breaking or other known disadvantageous phenomena. This problem is now described with reference to FIG. 5.

In a conventional method of injecting a melted resin material into cavities without multistage injection, a plunger engaged in a pot 109 is first upwardly moved to pressurize and inject a melted resin material through a cull portion 119 and a gage 121 into cavities 110 and 120 which are oppositely formed in a lower mold section 108 and an upper mold section 118, as shown in FIG. 5. The speed of injecting the resin in the cavities 110 and 120 can be adjusted by controlling the speed of upwardly moving the plunger.

If the resin injection speed is high, the resin is injected into the cavities 110 and 120 to spout from a port 121a. Thus, the injected resin entrains air which is present around the port 121a, to form voids and defects in the vicinity of the port 121a. Further, a spiral flow of the resin is caused in the cavities 110 and 120 and entrains air remaining therein to form voids and defects, while causing a wire sweep phenomenon of a bonding wire 152, electrode disengagement, wire breaking or other known disadvantageous phenomena.

When multistage injection, i.e., a molding method of adjusting the speed or pressure of injecting the melted resin material into the cavities 110 and 120 under constant conditions, is employed, on the other hand, the following action is obtained. The speed of injecting the resin through the port 121a is relatively reduced during a time and in a range (A in FIG. 5) where the resin is completely charged around the port 121a, and during a time and in a range (C in FIG. 5) where the resin is charged around the wire 152. In the remaining ranges (B and D in FIG. 5), the resin is injected at an ordinary injection speed, which is higher than that in the ranges A and C.

In this case, it is possible to suppress spouting of the resin that is injected from the port 121a into the cavities 110 and 120 by reducing the injection speed therefor in the range A shown in FIG. 5, thereby preventing the injected resin from entrainment of air and occurrence of a spiral flow in the vicinity of the port 121a.

In the range B shown in FIG. 5, on the other hand, it is possible to inject the resin at an ordinary injection speed since no bonding wire 152 is provided in this range B. While the resin is injected at the ordinary injection speed also in the range A at this time, neither entrainment of air nor occurrence of a spiral flow is caused in the injected resin in the vicinity of the port 121a since the range A is already charged or filled with the resin.

Then, the injection speed for the resin is reduced, because the bonding wire 152 is provided in the range C shown in FIG. 5, so as to prevent the front surface of the resin being injected into the cavities 110 and 120 from forcibly coming into contact with and thus bending the bonding wire 152. In this manner, it is aimed to prevent a wire sweep phenomenon of the bonding wire 152, electrode disengagement and wire breaking caused by such bending action.

Then, the resin can be injected at an ordinary injection speed in the range D, which contains no bonding wire 152. While the resin is injected at the ordinary injection speed also through the ranges A to C at this time, neither entrainment of air nor occurrence of a spiral flow is caused in the injected resin in the vicinity of the port 121a since the ranges A to C are already charged or filled with the resin.

By using such multistage injection, it is possible to solve the aforementioned problems of formation of voids and defects, a wire sweeping phenomenon of the bonding wire 152 and other problems which are caused by the resin spouting from the port 121a into the cavities 110 and 120.

The aforementioned countermeasure for preventing the occurrence of voids by high-pressure compression molding can be compared to multistage injection by the following features. The aforementioned high-pressure compression molding is effective for preventing the occurrence of voids, but suffers the problems of a wire sweep phenomenon of a bonding wire, electrode disengagement and wire breaking. While multistage injection can prevent a wire sweep phenomenon, electrode disengagement and wire breaking, it is not effective for preventing the occurrence of voids.

It may be possible to carry out high-pressure compression molding after carrying out multistage injection. However, the aforementioned problems following high-pressure compression molding cannot be solved by such means. Consequently, it is impossible to make effective use of multistage injection when the conventional countermeasure of high-pressure compression molding is used for preventing occurrence of voids.

SUMMARY OF THE INVENTION

An object of the present invention is to enable molding of products having high quality and reliability by efficiently and reliably discharging air, moisture, or air and moisture remaining in an internal die space or contained in resin tablets, and gas generated upon heating of the resin tablets, to the exterior of the internal die space in a short time thereby preventing the occurrence of voids and defects in resin molded members resulting from infiltration of the gas in melted resin materials and improving the adhesion between lead frames and the resin.

Another object of the present invention is to provide a method of preventing the occurrence of voids and defects, which method can make effective use of multistage injection, thereby preventing a wire sweep phenomenon of bonding wires caused by the resin.

In order to attain the aforementioned objects, the inventive method of molding resin to seal electronic parts comprises the following steps.

First, resin tablets are supplied into a plurality of pots arranged in a die for resin molding, consisting of an upper mold section and a lower mold section, and electronic parts mounted on lead frames are set into prescribed positions of cavities defined in the die. Then, the resin tablets in the pots are heated. The upper mold section and the lower mold section are closed to engage the electronic parts on the lead frames in the prescribed positions of the cavities.

Then, an internal die space, which is defined by at least the pots, resin passages and the cavities when the die is closed, is cut off or sealed from the exterior. In this state, a first evacuation is carried out for forcibly sucking air and moisture remaining in the internal die space, air and moisture flowing out from the resin tablets and gas generated by heating, and discharging the same to the exterior of the internal die space. Then, a second or instantaneous evacuation is carried out for forcibly sucking and discharging the above mentioned air, moisture and gas in a short time.

Thereafter the resin tablets in the pots of the die are pressurized to inject hot melted resin material into the cavities, which are arranged on side positions of the pots, through the respective resin passages, thereby molding resin to seal the electronic parts provided on the lead frames, which are engaged in the cavities.

According to this method, it is possible to improve the degree of vacuum in the internal die space in a short time, by discharging the air, moisture and gas from the internal die space through a first evacuation and a second or instantaneous evacuation while cutting off the internal die space from the exterior.

Further, it is possible to improve the degree of vacuum in the internal die space by a synergistic effect of the first evacuation and the second instantaneous evacuation.

Therefore, it is possible to prevent the air, moisture and gas contained in the internal die space from infiltrating into or being entrained in the melted resin material. Consequently, it is possible to reliably prevent formation of voids and defects, resulting from presence of the air, moisture and gas, in the interior and exterior of resin molded members.

The lead frames and the resin molded members so strongly adhere to each other that no voids and clearances exist between the lead frames and the resin, and the products are improved in moisture resistance to attain high quality and high reliability.

Further, the air, moisture, or air and moisture remaining in the internal die space or contained in the resin tablets, and the gas generated upon heating of the resin tablets, which are main causes of forming voids in the interior and the exterior of the resin molded members, can be efficiently and reliably discharged to the exterior of the internal die space in a short time. Thereby, it is not necessary to carry out the conventional high-pressure compression molding, which is employed as a counter-measure for preventing the occurrence of voids. Therefore, it is possible to make effective use of the aforementioned multistage injection as a countermeasure for protecting the bonding wires during resin molding.

In the inventive method of molding resin to seal electronic parts, the evacuation and the instantaneous evacuation steps can be continuously carried out in this order or vice versa, while it is also possible to simultaneously carry out these steps.

In a preferred embodiment of the inventive method of molding resin to seal electronic parts, the resin tablets are thermally expanded by heating the resin tablets so that the interior and the exterior of the resin tablets are in communication for ventilation, whereupon the instantaneous evacuation step is then carried out.

In order to attain the aforementioned objects, the inventive apparatus for molding resin to seal electronic parts comprises a resin molding die consisting of an upper mold section and a lower mold section arranged oppositely to each other and having a plurality of pots, a plurality of cavities and a plurality of resin passages in communication with each other, means for supplying resin tablets to the respective pots, means for supplying and setting electronic parts mounted on lead frames into prescribed positions in the cavities, means for closing the die while receiving the resin tablets in the pots and setting the electronic parts in the cavities and heating the resin tablets for melting the same, and means for injecting melted resin material into the cavities through the resin passages for molding the resin to seal the electronic parts. The inventive apparatus for molding resin to seal electronic parts further comprises means for cutting off or sealing an internal space, which is defined upon closing of the die, including at least the respective pots, resin passages and cavities, from the exterior, evacuation means for forcibly sucking and discharging air, moisture and gas contained in the internal die space to the exterior thereof for improving the degree of vacuum in the internal die space, and instantaneous evacuation means for forcibly sucking and discharging the air, moisture and gas contained in the internal die space to the exterior thereof in a short time for quickly improving the degree of vacuum in the internal die space.

In a preferred embodiment of the inventive apparatus for molding resin to seal electronic parts, the evacuation means includes a vacuum source and the instantaneous evacuation means includes a vacuum tank. Three ends of a vacuum path having three branches are connected to the vacuum source, the vacuum tank and the internal die space to communicate with the same, and switching valves are provided between the branches and the vacuum tank as well as the internal space.

Due to the aforementioned structure, it is possible to bring the vacuum tank into a prescribed vacuum state or condition by driving the vacuum source while closing the switching valve provided between the branch and the internal die space and opening the valve provided between the branch and the vacuum tank. It is then possible to instantaneously suck air, moisture and gases contained in the internal die space into the vacuum tank by opening both switching valves when it is necessary to carry out the instantaneous evacuation. Therefore, it is possible to carry out the evacuation and the instantaneous evacuation through a single vacuum source. Consequently, it is possible to implement the inventive method of molding resin to seal electronic parts by an apparatus having a relatively simple structure.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
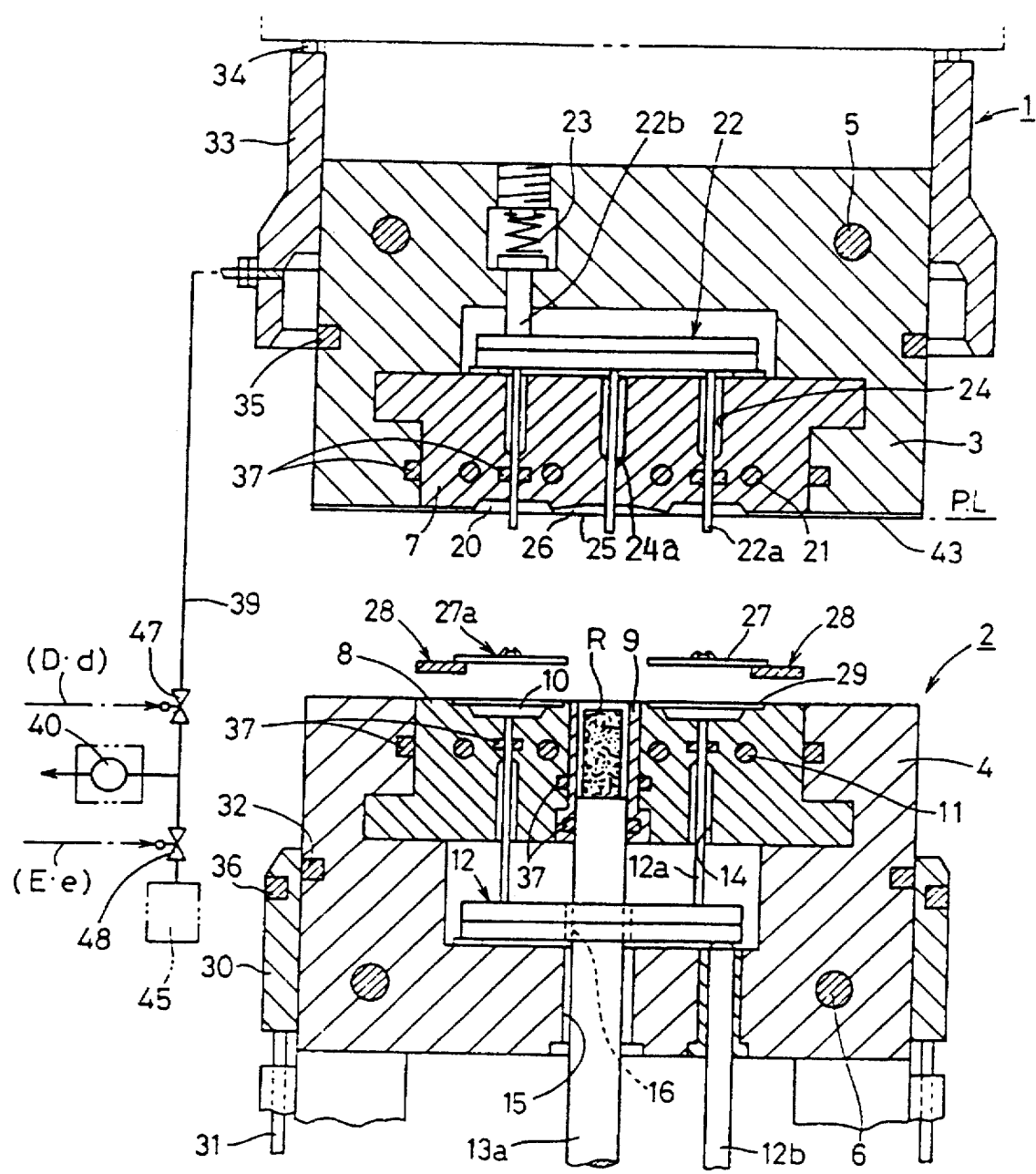
FIG. 1 is a partially fragmented sectional view showing a principal part of a die, provided in an apparatus for molding resin to seal electronic parts according to the present invention, which is in an opened state.

An embodiment of the present invention will now be described in detail with reference to FIGS. 1 to 4.

The resin sealing/molding apparatus shown in FIGS. 1 to 4 includes in opposite facing relation an upper mold section 1 (fixed type) mounted on an upper fixed plate and a lower mold section 2 (movable type) mounted on a lower movable plate.

Further, die bases 3 and 4 of the upper mold section 1 and the lower mold section 2 are provided with heating means 5 and 6 such as heaters respectively.

A fixed chase block 7 is detachably mounted on the fixed die base 3 by proper engaging means such as a dovetail groove and a dovetail portion.

On the other hand, a movable chase block 8 is detachably mounted on the movable die base 4 by engaging means similar to those provided on the fixed side.

The chase blocks 7 and 8, which are engaged in the die bases 3 and 4, are set in prescribed positions by proper fixing blocks (not shown) for fixing the blocks at horizontal ends thereof.

Proper seal members (not shown) are preferably inserted between the chase blocks 7 and 8 and the fixing blocks.

The movable chase block 8 is provided with a plurality of pots 9, while a required number of resin molding cavities 10 are arranged to the sides of the respective pots 9.

The movable chase block 8 is also provided with dedicated heating means 11 such as heaters.

Cooperating with the movable chase block 8, from its bottom side, the movable die base 4 further includes a lower ejector plate 12 comprising ejector pins 12a for ejecting and releasing resin molded members which are molded in the cavities 10, and a plunger holder 13 (see FIG. 3) comprising plungers 13a (resin pressurizing means) for pressurizing the melted resin of resin tablets R which are supplied into the pots 9 respectively.

Upper end portions of the ejector pins 12a are engaged in pin holes 14 communicating with the cavities 10. Further, upper portions of the plungers 13a are engaged in the respective pots 9 through insertion holes 15 and 16 provided in the movable die base 4 and the ejector plate 12.

Proper seal members (not shown) are preferably inserted between an engaging space for the lower ejector plate 12, which is provided in the movable die base 4, and the exterior of this space as well as between the plungers 13a and the engaging space.

On the other hand, the fixed chase block 7 is provided with cavities 20 in correspondence to the positions and the number of the cavities 10 provided in the movable chase block 8. The fixed chase block 7 is further provided with cull portions 25, arranged opposite the pots 9 of the movable chase block 8. The cull portions 25 and the cavities 20 communicate with each other through resin passages 26, whereby the pots 9 and the cavities 10 and 20 communicate with each other through the short resin passages 26 including the cull portions 25 when the upper mold section 1 and the lower mold section 2 are closed. Further, the plungers 13a engaged in the pots 9 are vertically driven by a proper driving mechanism (not shown) such as a hydraulic, pneumatic or electric motor.

When the plungers 13a pressurize the resin tablets R which have been supplied into the pots 9, resin materials heated and melted in the pots 9 are injected into the cavities 10 and 20 through the resin passages 26 including the cull portions 25.

The upper cavities 20 are provided with air vents 43 (see FIG. 4) for making the cavities 10 and 20 communicate with the exterior upon closing thereof.

The fixed chase block 7 is further provided with dedicated heating means 21 such as heaters.

Cooperating with the fixed chase block 7, from its bottom side, the fixed die base 3 further includes a support pin 22b for an upper ejector plate 22 comprising ejector pins 22a for ejecting and releasing resin molded members which are molded in the cavities 20, and an elastic member 23 such as a spring for downwardly pressing the upper ejector plate 22 through the support pin 22b.

Lower end portions of the ejector pins 22a are engaged with pin holes 24 communicating with the cavities 20 and pin holes 24a communicating with the cull portions 25 respectively (shown only in FIG. 1 as an example).

The upper ejector plate 22 is downwardly pressed by elasticity of the elastic member 23 when the upper mold section 1 and the lower mold section 2 are opened as shown in FIG. 1, so that hardened resin members in the resin passages 26 provided between the cull portions 25 and the cavities 20 and the resin molded members hardened in the cavities 20 can be downwardly ejected and released.

When the upper mold section 1 and the lower mold section 2 are opened, further, the lower ejector plate 12 is upwardly pressed by an ejector bar 12b, so that the ejector pins 12a upwardly eject and release the resin molded members from the cavities 10.

Figure 3:
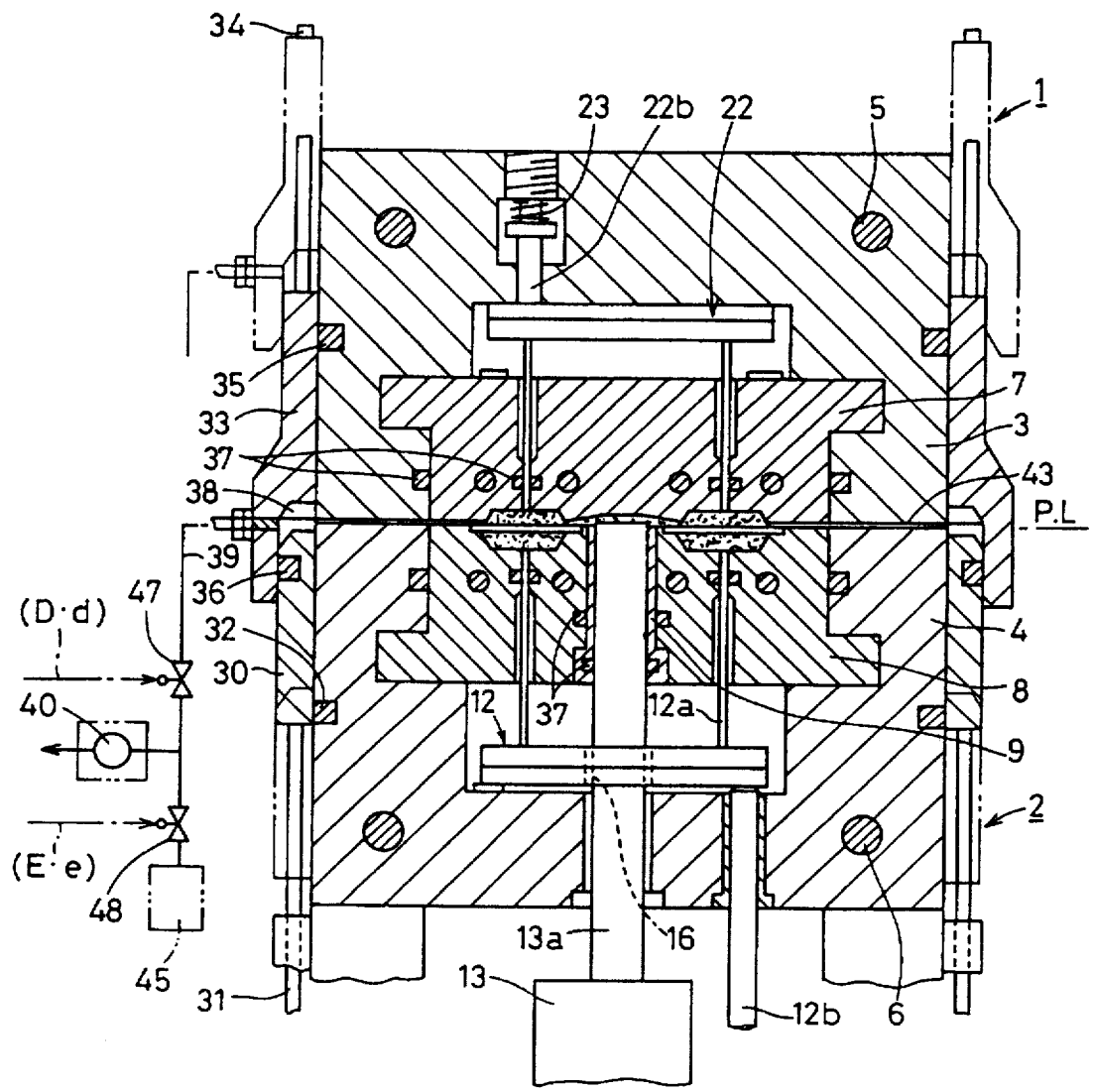
FIG. 3 is a partially fragmented sectional view of the die shown in FIG. 1, which is in a completely closed state for molding resin to seal electronic parts.
Figure 4:
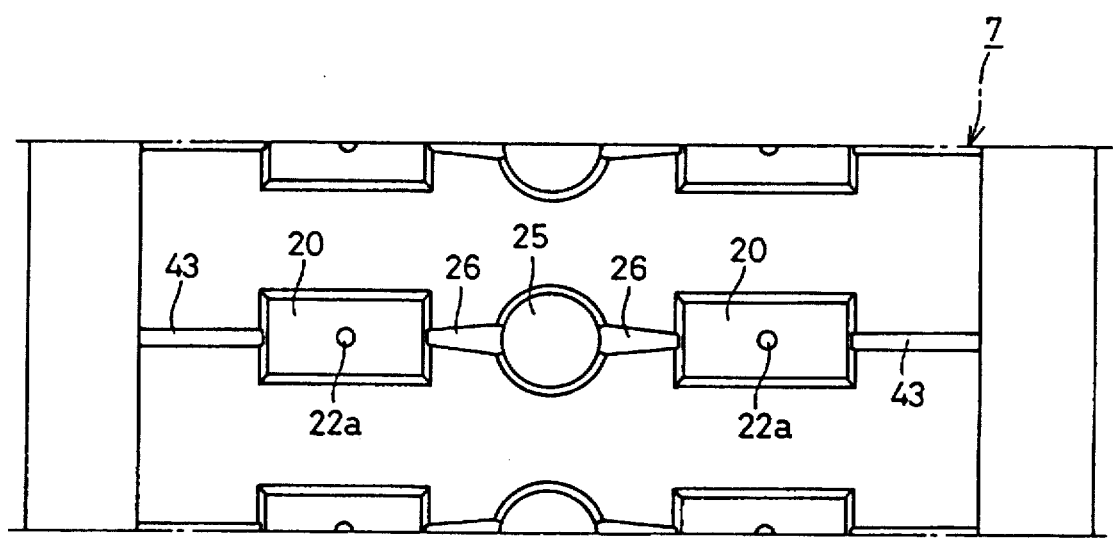
FIG. 4 is a partially fragmented bottom plan view showing a principal part of a die surface of an upper mold section provided in the die shown in FIG. 1.
Figure 5:
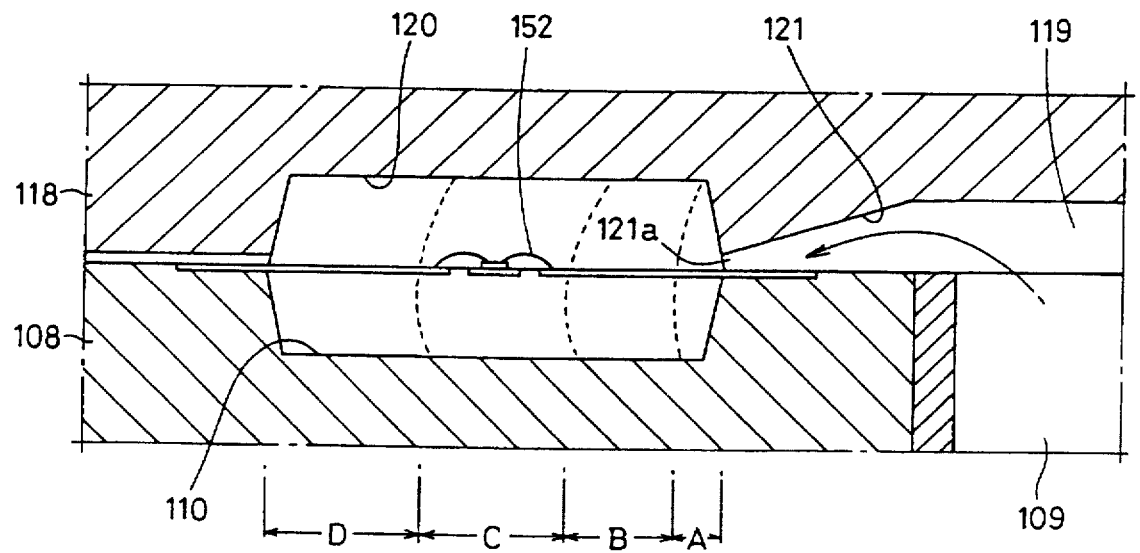
FIG. 5 is a partially fragmented sectional view showing a portion of a die around cavities, for illustrating a state of injecting a melted resin material into the cavities from a pot through a resin passage.

When the upper mold section 1 and the lower mold section 2 are completely closed as shown in FIG. 3, the ejector plates 22 and 12 are upwardly and downwardly retracted respectively through upper and lower return pins (not shown) which are oppositely provided on the ejector plates 22 and 12.

An outside air blocking member 30 in the form of a circular or rectangular cylinder is engaged with the movable die base 4 for covering at least outer peripheries of the pots 9 and the cavities 10 in a die surface of the lower mold section 2. This outside air blocking member 30 is slidable parallel to the direction of opening and closing the upper mold section 1 and the lower mold section 2, through a required driving mechanism 31.

Further, a proper seal member 32 is interposed between the engaging surfaces of the movable die base 4 and the outside air blocking member 30.

Another outside air blocking member 33 in the form of a circular or rectangular cylinder is engaged with the fixed base 3 for covering outer peripheries of the resin passages 25 and 26 and the cavities 20 in a die surface of the upper mold section 1. This outside air blocking member 33 is slidable parallel to the direction of opening and closing the upper mold section 1 and the lower mold section 2, through a proper driving mechanism 34.

Further, a proper seal member 35 is interposed between the engaging surfaces of the fixed die base 3 and the outside air blocking member 33.

Figure 2:
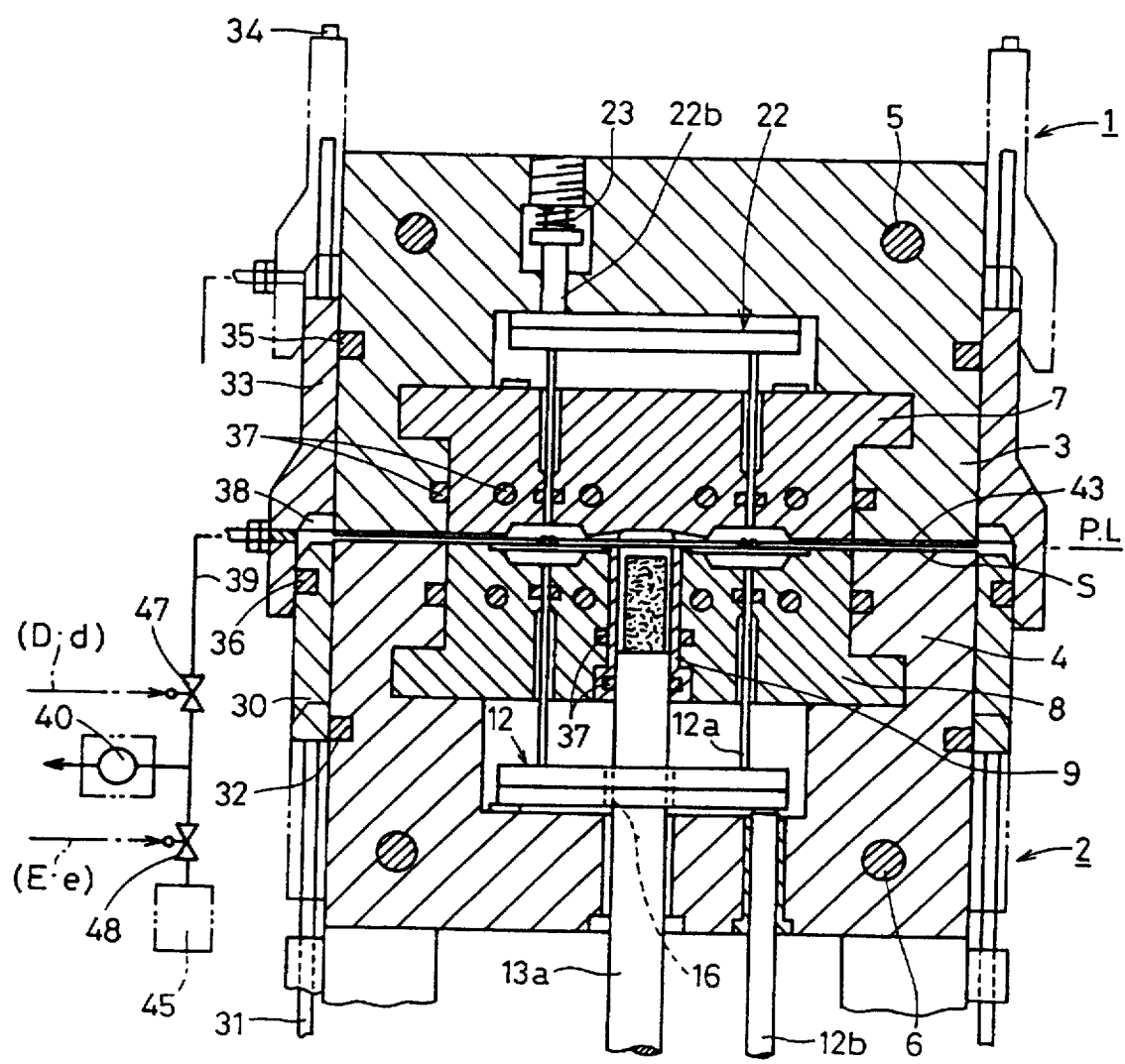
FIG. 2 is a partially fragmented sectional view of the die shown in FIG. 1, which is in an intermediately closed state in advance of complete closing.

When the outside air blocking members 30 and 33 are moved to close the upper mold section 1 and the lower mold section 2 through the driving mechanisms 31 and 34 respectively, forward ends of these outside air blocking members 30 and 33 are engaged with each other (see FIGS. 2 and 3).

Referring to FIG. 3, an upper end of the outside air blocking member 30 movably mounted on the movable die base 4 is upwardly moved to a position close to the die surface of the lower mold section 2, while the outside air blocking member 33 movably mounted on the fixed die base 3 is downwardly moved to engage an outer peripheral surface of the outside air blocking member 30.

While the engaging surfaces of the outside air blocking members 30 and 33 are vertical in the figures, other proper engaging surfaces may be employed in place of such a structure.

Further, a proper seal member 36 is interposed between the engaging surfaces of the outside air blocking members 30 and 33.

In addition, proper seal members 37 are interposed between the die bases 3 and 4 and the chase blocks 7 and 8, between the chase blocks 7 and 8 and the ejector pins 22a and 12a, and between the movable chase block 8 and the pots 9 and the plungers 13a.

When the upper mold section 1 and the lower mold section 2 are closed, therefore, the forward ends of the outside air blocking members 30 and 33 are so engaged as to define an outside air blocking space 38 (see FIGS. 2 and 3), i.e. a sealed space that is cut off from the outside air by the outside air blocking members 30 and 33 and the seal members 32, 35, 36 and 37.

The seal members 32, 35, 36 and 37 may simply define the space 38 which requires a proper vacuum state between the upper mold section 1 and the lower mold section 2.

The outside air blocking members 30 and 33 can be retracted through the driving mechanisms 31 and 34 to positions not inhibiting operations for detaching the chase blocks 7 and 8 from the die bases 3 and 4 and exchanging the same.

Thus, it is possible to open and close the upper mold section 1 and the lower mold section 2 while keeping the outside air blocking members 30 and 33 located in the positions shown in FIGS. 2 and 3, for example, whereby the outside air blocking members 30 and 33 need not be retracted in every molding cycle in ordinary resin molding.

The driving mechanisms 31 and 34 for the outside air blocking members 30 and 33 may be mechanical driving mechanisms such as rack and pinion mechanisms, electric driving mechanisms such as electric motors, or hydraulic or pneumatic fluid driving mechanisms. The aforementioned electric driving mechanisms or pneumatic driving mechanisms are preferable in consideration of the operation for molding resin to seal electronic parts.

Concave portions 29 for receiving lead frames 27 that carry the electronic parts 27a are provided in the die surface of the movable chase block 8.

Referring to FIG. 1, reference numeral 28 denotes lead frame supply/discharge mechanisms for supplying/setting the lead frames 27 in the concave portions 29.

The space 38 defined upon engagement of the outside air blocking members 30 and 33 is connected with an end of a vacuum path 39 such as a vacuum pipe to communicate with the same. The other end of the vacuum path 39 is connected and communicates with a vacuum source 40 consisting of a vacuum pump or other known vacuum source preferably an active vacuum source, and an instantaneous evacuation mechanism 45 consisting of a vacuum tank or other vacuum reservoir, preferably a passive vacuum reservoir.

Namely, the space 38 is connected and communicates with the vacuum source 40 through a switching valve 47, such as an electromagnetic valve, provided in the vacuum path 39.

Further, the space 38 is connected and communicates with the instantaneous evacuation mechanism 45 through the switching valve 47 provided in the vacuum path 39 and another switching valve 48 such as an electromagnetic valve.

The vacuum source 40 is connected between the switching valves 47 and 48 in a communicative manner. Therefore, when the vacuum source 40 is driven while opening the switching valve 47 by an opening signal D and closing the other switching valve 48 by a closing signal e, for example, it is possible to evacuate the space 38 using the vacuum source 40 through the switching valve 47 and the vacuum path 39.

When the vacuum source 40 is driven while closing the switching valve 47 by a closing signal d and opening the other switching valve 48 by an opening signal E, on the other hand, it is possible to pump down or bring the instantaneous evacuation mechanism (vacuum tank) 45 into a prescribed vacuum state by evacuation through the switching valve 48 and the vacuum path 39.

Following is a description of a procedure for evacuating the space 38 defined when the upper mold section 1 and the lower mold section 2 are closed as shown in FIG. 2 or 3 and an internal die space defined by at least the pots 9, the resin passages 25 and 26 and the cavities 10 and 20 is cut off from the exterior, using normal evacuation and instantaneous evacuation for quickly improving the degree of vacuum in the space 38.

First, the vacuum source 40 is driven while closing the switching valve 47 by the closing signal d and opening the switching valve 48 by the opening signal E, thereby bringing the instantaneous evacuation mechanism 45 into a prescribed vacuum state. At this time, the degree of vacuum in the instantaneous evacuation mechanism (vacuum tank) 45 can be arbitrarily set at a proper level as desired.

Then, the switching valve 47 is opened by the opening signal D so that the space 38 communicates with the instantaneous evacuation mechanism 45 through the switching valves 47 and 48 and the vacuum path 39, whereby air remaining in the space 38 is instantaneously and forcibly sucked out and discharged to the exterior in a short time by the instantaneous evacuation mechanism 45 which is maintained in the prescribed degree of vacuum. Thus, it is possible to carry out an instantaneous evacuation for quickly increasing the degree of vacuum in the space 38. At this time, a high degree of vacuum can be attained in the space 38 in several seconds.

The space 38 communicates with the vacuum source 40 through the switching valve 47 and the vacuum path 39. Therefore, it is possible to carry out normal evacuation through the vacuum source 40 for forcibly sucking out and discharging the air remaining in the space 38 to the exterior in continuation to the aforementioned instantaneous evacuation, by driving the vacuum source 40 while closing the switching valve 48 by the closing signal e.

Due to the evacuation through the vacuum source 40, it is possible to maintain or further increase the degree of vacuum in the space 38 that has been attained by the instantaneous evacuation. Thus, it is possible to instantaneously evacuate the space 38 to a high vacuum state in a short time, by carrying out the instantaneous evacuation through the instantaneous evacuation mechanism 45 and the normal evacuation through the vacuum source 40.

The evacuation is continued while closing the switching valve 48, so that only the vacuum source 40 and the space 38 communicate with each other for efficiently carrying out the evacuation without reducing the function of the vacuum source 40.

In the instantaneous evacuation and the normal evacuation of the space 38, it is possible to forcibly suck or discharge air and moisture remaining in the space 38, air and moisture flowing out from the resin tablets R heated and expanded in the pots 9 into the space 38, and gas generated by heating, to the exterior of the space 38.

Following is a description of an operation for molding resin to seal the electronic parts 27a, which are mounted on the lead frames 27, with resin through the apparatus having the aforementioned structure.

First, the vacuum source 40 is driven after having closed the switching valve 47 by the closing signal d and having opened the switching valve 48 by the opening signal E, thereby bringing the instantaneous evacuation mechanism (vacuum tank) 45 into a prescribed vacuum state through the switching valve 48 and the vacuum path 39.

Then, the lower mold section 2 is downwardly moved to open the upper mold section 1 and the lower mold section 2, as shown in FIG. 1. Then, the resin tablets R are supplied into the pots 9 provided in the lower mold section 2, while the lead frames 27 are supplied/set in the concave portions 29 provided in the die surface of the movable chase block 8 through the lead frame supply/discharge mechanisms 28.

The resin tablets R are then heated and expanded/softened by the heating means 5, 6, 11 and 21 provided in the upper mold section 1 and the lower mold section 2, to be gradually melted.

Then, the lower mold section 2 is upwardly moved so that the upper mold section 1 and the lower mold section 2 are closed while the outside air blocking members 30 and 33 are slid to be engaged with each other, thereby defining the outside air blocking space 38 covering a space between the die surfaces of the upper mold section 1 and the lower mold section 2 and at least the outer peripheries of the pots 9, the resin passages 25 and 26 and the cavities 10 and 20, as shown in FIGS. 2 and 3.

The upper mold section 1 and the lower mold section 2 are intermediately closed to define a required space S between the die surfaces thereof as shown in FIG. 2, and then completely closed to join the die surfaces with each other as shown in FIG. 3. Such intermediate closing and complete closing are carried out in continuation.

In the aforementioned closing, particularly in the intermediate closing of the upper mold section 1 and the lower mold section 2, an instantaneous evacuation step is carried out by the instantaneous evacuation mechanism 45.

Namely, the switching valve 47 is opened by the opening signal D so that the space 38 communicates with the instantaneous evacuation mechanism 45 through the switching valves 47 and 48 and the vacuum path 39, thereby instantaneously and forcibly sucking and discharging the air, moisture and gases remaining in the space 38 and the pots, resin passages and cavities as described above, to the exterior in a short time.

At this time, therefore, the degree of vacuum in the space 38 is quickly improved to attain a high degree of vacuum in several seconds.

Then, the switching valve 48 is closed by the closing signal e and the vacuum source 40 is driven to carry out an evacuation step of forcibly sucking and discharging the air, moisture and gases remaining in the space 38 and the pots, resin passages and cavities as described above, to the exterior in continuation to the instantaneous evacuation step by the instantaneous evacuation mechanism 45.

At this time, therefore, it is possible to maintain the degree of vacuum in the space 38 which has been attained by the instantaneous evacuation, or further improve the degree of vacuum.

The resin tablets R in the pots 9 are heated and expanded/softened by the heating means 5, 6, 11 and 21 provided in the upper mold section 1 and the lower mold section 2, while the interior and the exterior of the resin tablets R are brought into ventilative states so that air and moisture contained therein flow out into the pots 9. Namely, the resin tablets R are efficiently and quickly expanded by thermal expansion through heating by radiation heat and conduction heat received from the pots 9, expansion through the evacuation in the pots 9 and the synergistic action/effect of these actions. Even if the resin tablets R contain a number of fine independent bubbles, therefore, such independent bubbles are reliably broken by the aforementioned expansion of the resin tablets R. Therefore, the interior of the resin tablets R easily communicates with the exterior to be in ventilative states, whereby air and moisture contained in the number of independent bubbles reliably flow out into the pots 9 (space 38). Further, the resin tablets R generate gas upon heating and release such gas into the pots 9.

Therefore, it is possible to instantaneously evacuate the space 38 to a high vacuum state in a short time by carrying out the instantaneous evacuation through the instantaneous evacuation mechanism 45 and the normal evacuation through the vacuum source 40. Consequently, all of the air and moisture remaining in the space 38, the air and moisture flowing out from the resin tablets R into the space 38 (pots 9) and the gas generated by heating of the resin tablets R can be forcibly sucked out and discharged to the exterior of the space 38.

The resin tablets R contain moist air in a number of independent bubbles, which cannot communicate with each other and with the surfaces of the resin tablets R. When the resin tablets R are heated to a resin molding temperature in the pots 9, therefore, the resin tablets R are expanded/softened and finally melted as follows.

Bottom surfaces of the resin tablets R are placed on upper end surfaces of the plungers 13a and clearances are defined between the side surfaces of the tablets R and the inner wall surfaces of the pots 9, while open space portions are defined between the upper surfaces of the tablets and the cull portions 25.

In this state, therefore, conduction heat and radiation heat are applied to the bottom surfaces and the side surfaces of the resin tablets R respectively. Therefore, heating values on the bottom portions of the resin tablets R, which are in contact with the upper end surfaces of the plungers 13a, are first increased, so that the bottom portions are softened first and then successively the central portions. Consequently, upper central portions of the resin tablets R are upwardly pressed from the interior to be expanded toward upper portions in the pots 9 (i.e., toward the cull portions 25) in advance of other portions.

At this time, the interior and the exterior of the resin tablets R communicate with each other to enter ventilative states, whereby the air and moisture trapped in the independent bubbles easily flow out into the space 38 (pots 9).

Since the space 38 is under a high vacuum state at this time, the air and moisture contained in the resin tablets R is forcibly sucked to flow into the space 38 (pots 9), and is efficiently and reliably discharged to the exterior by evacuation.

Then, the upper mold section 1 and the lower mold section 2 are completely closed, to thereafter carry out a resin molding step of sealing the electronic parts 27a carried on the lead frames 27 in resin molded members.

When the upper mold section 1 and the lower mold section 2 are completely closed, the resin tablets R received in the pots 9 are pressurized by the plungers 13a so that melted resin materials which have been heated and melted in the pots 9 are injected/charged into required numbers of the cavities 10 and 20 which are arranged to the sides of the pots 9. Thus, the electronic parts 27a provided on the lead frames 27 which are engaged/set in the respective cavities 10 and 20 can be sealed in the resin molded members.

As hereinabove described, the evacuation step of forcibly sucking/discharging the air remaining in the space 38 and other areas defined above to the exterior is continuously carried out also when the upper mold section 1 and the lower mold section 2 are intermediately and completely closed.

The residual air and moisture can be relatively easily discharged from the space 38 to the exterior due to the required space S defined in the space 38 particularly between the die surfaces of the upper mold section 1 and the lower mold section 2 when the same are intermediately closed. In comparison, it is relatively difficult to discharge the residual air and moisture from the space 38 when the upper mold section 1 and the lower mold section 2 are completely closed since no space S is defined between the die surfaces at this time and evacuation can only be carried out through air vents 43 as described next.

When the upper mold section 1 and the lower mold section 2 are completely closed, however, the vacuum source 40 or the instantaneous evacuation mechanism 45 communicates with the pots 9, the resin passages 25 and 26 and the cavities 10 and 20 through the air vents 43 and the vacuum path 39, whereby the function for discharging the residual air, moisture and gases from the space 38 to the exterior is not deteriorated. Thus, it is possible to discharge the residual air, moisture and gases from the space 38 whether the upper mold section 1 and the lower mold section 2 are intermediately or completely closed.

Then, the upper mold section 1 and the lower mold section 2 may be again opened after a required curing time, so that the resin molded members and hardened resin are released from the cavities 10 and 20 and the resin passages 25 and 26 respectively by the ejector plates 22 and 12 and the ejector pins 22a and 12a.

Figure 6:
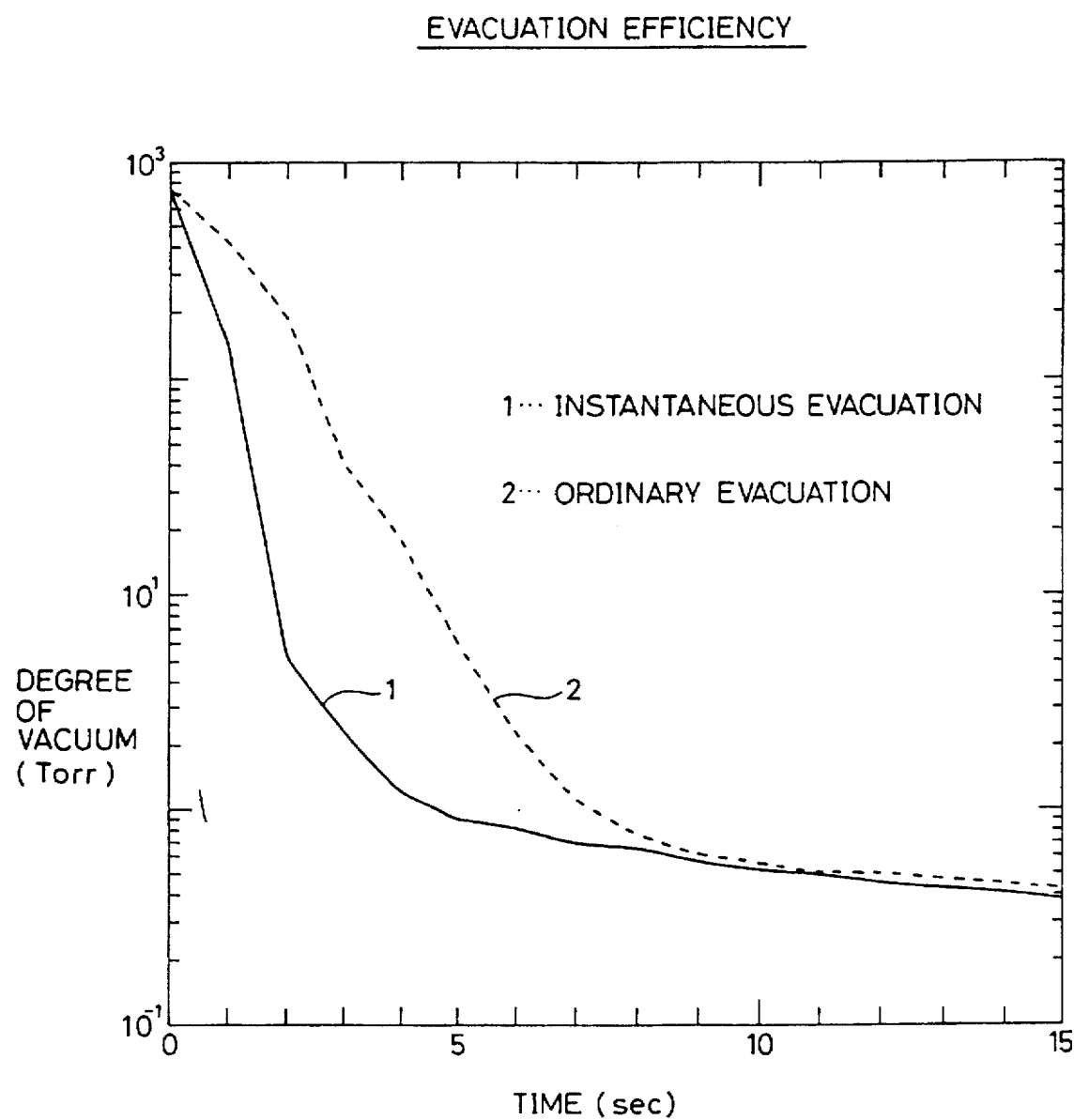
FIG. 6 is a graph showing exemplary evacuation efficiency levels in an ordinary evacuation and an instantaneous evacuation carried out in an internal die space.

According to a graph of evacuation efficiency in the internal die space shown in FIG. 6, it is possible to attain a high vacuum state in several seconds (about 2 to 3 seconds) when only instantaneous evacuation is carried out (see the solid line 1). Further, it is understood that about six to seven seconds are required for attaining a high vacuum state only by ordinary evacuation (see the broken line 2). Therefore, it is possible to achieve a long evacuation time in the internal die space by carrying out an instantaneous evacuation for initially bringing the internal die space into a high vacuum state in a short time. Thus, it is possible to efficiently and reliably discharge air remaining in the internal die space, air flowing out from the aforementioned resin tablets and gas generated upon heating and melting of the resin tablets to the exterior before the resin tablets are completely heated and melted in the pots.

The present invention is not restricted to the aforementioned embodiment, but modifications can be arbitrarily and properly selected and employed as needed within the scope of the present invention.

For example, the lower mold section 2 may not be completely stopped in intermediate closing, but instead the closing speed (speed for upwardly moving the lower mold section 2) may be reduced between the intermediate closing state shown in FIG. 2 and the complete closing state shown in FIG. 3, to continuously carry out the intermediate closing and the complete closing.

The evacuation step and the instantaneous evacuation step for the outside air blocking space 38 may be arbitrarily and properly modified/selected on the basis of resin molding conditions and the like.

For example, the instantaneous evacuation step for the space 38 may be continuously carried out following the evacuation step, and vice versa.

Further, the instantaneous evacuation step for the space 38 may be carried out simultaneously with the evacuation step.

Further, air holes communicating with the engaging space for the ejector plates 12 and 22 may be provided to communicate with the outside air blocking space 38 or with another vacuum path, to discharge residual air, moisture and gases from the engaging space to the exterior.

Further, air holes communicating with the outside air blocking space 38 may be provided in sliding portions of the pots 9 and the plungers 13a or such air holes may communicate with another vacuum path, to discharge the residual air, moisture and gases from the pots 9 to the exterior.

Further, a plurality of vacuum sources 40 such as vacuum pumps may be combined with a plurality of instantaneous evacuation mechanisms 45 such as vacuum tanks, while such members may be combined independently of each other.

While the chase blocks 7 and 8 are frequently detached in the aforementioned embodiment, the present invention is also applicable to an apparatus for molding resin to seal electronic parts having an ordinary die structure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of molding resin to seal electronic parts, comprising:

(a) supplying resin tablets into respective ones of a plurality of pots arranged in a die for resin molding including an upper mold section and a lower mold section;

(b) supplying and setting electronic parts mounted on lead frames in prescribed positions of cavities arranged in said die to sides of said pots;

(c) heating and expanding said resin tablets in said pots of said die;

(d) closing said upper mold section and said lower mold section for engaging said electronic parts mounted on said lead frames in prescribed positions of said cavities;

(e) cutting off from the exterior an internal die space defined in said step (d) by at least said pots, said cavities and resin passages communicating said pots with said cavities;

(f) a first evacuation step of forcibly sucking out and discharging air and moisture remaining in said internal die space, air and moisture flowing out from said resin tablets in said resin tablet heating step into said internal die space, and gas being generated by said heating, to the exterior of said internal die space in said step (e);

(g) a second evacuation step of forcibly sucking out and discharging said air and moisture remaining in said internal die space, said air and moisture flowing out from said resin tablets in said resin tablet heating step into said internal die space, and said gas being generated by said heating, to the exterior of said internal die space in a time shorter than that required for said first evacuation step in said step (e), thereby increasing the degree of vacuum in said internal die space more quickly than does said first evacuation step; and (h) pressurizing said resin tablets in said pots of said die for injecting melted resin materials from said pots into said cavities through said resin passages, thereby sealing said electronic parts engaged in said cavities, with resin.

2. The method of molding resin to seal electronic parts in accordance with claim 1, wherein said second evacuation step is carried out after said first evacuation step.

3. The method of molding resin to seal electronic parts in accordance with claim 1, wherein said first evacuation step is carried out after said second evacuation step.

4. The method of molding resin to seal electronic parts in accordance with claim 1, wherein said second evacuation step is carried out simultaneously with said first evacuation step.

5. The method of molding resin to seal electronic parts in accordance with claim 1, wherein said second evacuation step is carried out after said resin tablets in said pots are heated and expanded in said step (c) so that the interior and the exterior of said resin tablets are brought into ventilative states.

6. The method of molding resin to seal electronic parts in accordance with claim 1, wherein said second evacuation step includes connecting a vacuum tank that has previously been brought into a prescribed vacuum state to said internal die space, and then disconnecting said vacuum tank from said internal die space.

7. The method of molding resin to seal electronic parts in accordance with claim 1, wherein said step (d) includes:

an intermediate closing step of defining a prescribed clearance between die surfaces of said upper mold section and said lower mold section, and a complete closing step of contacting said die surfaces of said upper mold section and said lower mold section to each other, and wherein both said first evacuation step and said second evacuation step are carried out in both said intermediate closing step and said complete closing step.

8. A method of molding resin to seal and encapsulate a component to be encapsulated, in a mold apparatus including an upper mold section and a lower mold section, which are relatively movable and which define a mold cavity therebetween in a closed state of the upper mold section and lower mold section contacting each other along a parting plane, a resin melting pot, a resin passage connecting said pot to said cavity, a hermetic sealing member that selectably closes a sealed space including said pot, said resin passage and said cavity, which are interconnected for fluid flow therebetween and hermetically sealed from an external atmosphere around said apparatus, and an active vacuum source and a passive vacuum reservoir selectably connected to said sealed space, wherein said method comprises:

(a) placing a resin tablet into said pot;

(b) placing said component to be encapsulated into said cavity;

(c) heating said resin tablet in said pot to melt said tablet into melted resin material;

(d) closing off said sealed space with said hermetic sealing member;

(e) connecting said active vacuum source to said sealed space, thereby sucking gases out of said sealed space;

(f) connecting said passive vacuum reservoir to said sealed space, thereby sucking gases out of said sealed space;

(g) relatively moving said upper mold section and said lower mold section into said closed state;

(h) pressurizing said melted resin material in said pot and injecting said melted resin material through said resin passage into said cavity; and (i) connecting said active vacuum source to said passive vacuum reservoir and evacuating said passive vacuum reservoir.

9. The method of claim 8, wherein said step (f) is discontinued before discontinuing said step (e).

10. The method of claim 8, wherein said step (e) and said step (f) are carried out at least partially overlapping one another.

11. The method of claim 8, wherein said step (f) is carried out to increase the degree of evacuation of said sealed space more quickly than by said step (e).

12. The method of claim 8, wherein an injection speed of injecting said melted resin material into said cavity in said step (h) varies over time during said step (h).

13. The method of claim 8, further comprising, before said step (d), an intermediate partial mold closing step of relatively moving said upper mold section and said lower mold section into close proximity without contacting each other along said parting plane to leave a clearance gap between said upper mold section and said lower mold section along said parting plane, and then comprising eliminating said clearance gap in said step (g).

14. The method of claim 13, wherein said intermediate partial mold closing step comprises temporarily stopping the relative movement of said upper mold section and said lower mold section when said clearance gap is established.

15. The method of claim 13, wherein said intermediate partial mold closing step comprises slowing and not stopping the relative movement of said upper mold section and said lower mold section when said clearance gap is established.

16. A method of molding resin to seal and encapsulate a component to be encapsulated, in a mold apparatus including an upper mold section and a lower mold section, which are relatively movable and which define a mold cavity therebetween in a closed state of the upper mold section and lower mold section contacting each other along a parting plane, a resin melting pot, a resin passage connecting said pot to said cavity, a hermetic sealing member that selectably closes a sealed space including said pot, said resin passage and said cavity, which are interconnected for fluid flow therebetween and hermetically sealed from an external atmosphere around said apparatus, and an active vacuum source and a passive vacuum reservoir selectably connected to said sealed space, wherein said method comprises:

(a) placing a resin tablet into said pot;

(b) placing said component to be encapsulated into said cavity;

(c) heating said resin tablet in said pot to melt said tablet into melted resin material;

(d) closing off said sealed space with said hermetic sealing member;

(e) connecting said active vacuum source to said sealed space, thereby sucking gases put of said sealed space;

(f) connecting said passive vacuum reservoir to said sealed space, thereby sucking gases out of said sealed space;

(g) relatively moving said upper mold section and said lower mold section into said closed state; and (h) pressurizing said melted resin material in said pot and injecting said melted resin material through said resin passage into said cavity;

wherein said mold apparatus includes a vacuum line connecting said passive vacuum reservoir and said active vacuum source in series to said sealed space, a first valve between said active vacuum source and said sealed space, and a second valve between said passive vacuum reservoir and said active vacuum source, and wherein said steps (e) and (f) comprise, in sequence, opening said first valve and said second valve, maintaining the opened state of said first and second valves for a time, and then closing said second valve while leaving open said first valve.

17. The method of claim 16, further comprising a step of closing said first valve and opening said second valve to connect said active vacuum source to said passive vacuum reservoir, and evacuating said passive vacuum reservoir.

* * * * *

UNITED STATES PATENT AND TRADEMARK OFFICE
CERTIFICATE OF CORRECTION

PATENT NO. : 5,603,879
DATED : Feb. 18, 1997
INVENTOR(S) : Osada et al.

It is certified that error appears in the above-indentified patent and that said Letters Patent is hereby corrected as shown below:

Col. 18, line 4, replace "put" by --out--.

Signed and Sealed this

Twenty-seventh Day of May, 1997

Attest:

BRUCE LEHMAN

Attesting Officer

Commissioner of Patents and Trademarks